(12) United States Patent  
Kolics

(10) Patent No.: US 8,895,441 B2  
(45) Date of Patent: Nov. 25, 2014

(54) METHODS AND MATERIALS FOR ANCHORING GAPFILL METALS

(75) Inventor: Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 176 days.

(21) Appl. No.: 13/404,274

(22) Filed: Feb. 24, 2012

(65) Prior Publication Data

US 2013/0224511 A1 Aug. 29, 2013

(51) Int. Cl.
*B32B 15/04* (2006.01)
*B32B 3/30* (2006.01)

(52) U.S. Cl.
CPC .. *B32B 15/04* (2013.01); *B32B 3/30* (2013.01)
USPC ............ 438/678; 257/E21.179; 257/E21.479; 427/123

(58) Field of Classification Search
CPC B05D 5/12; H01L 1/02063; H01L 21/02068; H01L 21/288; H01L 21/76814; H01L 21/76826; H01L 21/76874; C23C 18/32; C23C 18/34; C23C 18/36; C23C 18/38; C23C 18/40; C23C 18/42; C23C 18/44; C23C 18/1651; C23C 18/1875; C23C 18/1879; C23C 18/1882; C23C 18/1889; C23C 18/1893; C23C 18/1872; B32B 15/04; B32B 3/10; B32B 3/30; C09D 1/00
USPC ................... 438/678; 257/E21.174, E21.479; 427/123
See application file for complete search history.

(56) References Cited

U.S. PATENT DOCUMENTS

| 3,362,851 A | * | 1/1968 | Dunster ....................... 428/601 |
| 3,546,011 A | * | 12/1970 | Meyer-Simon et al. ........ 216/18 |
| 4,228,201 A | * | 10/1980 | Feldstein ...................... 438/606 |
| 4,313,761 A | | 2/1982 | Joyce, III et al. |
| 5,347,027 A | | 9/1994 | Ritscher et al. |
| 5,405,656 A | | 4/1995 | Ishikawa et al. |
| 5,554,211 A | | 9/1996 | Bokisa et al. |
| 5,695,810 A | * | 12/1997 | Dubin et al. .................. 438/643 |
| 6,303,500 B1 | * | 10/2001 | Jiang et al. .................... 438/678 |

(Continued)

FOREIGN PATENT DOCUMENTS

JP 2007203422 A 8/2007
WO WO 2009/086230 A3 7/2009

OTHER PUBLICATIONS

USPTO Office Action for U.S. Appl. No. 12/334,460, Kolics, Mailed on Jul. 26, 2012.

(Continued)

*Primary Examiner* — Mary Wilczewski
(74) *Attorney, Agent, or Firm* — Beyer Law Group LLP

(57) ABSTRACT

One aspect of the present invention includes a method of fabricating an electronic device. According to one embodiment, the method comprises providing a substrate having dielectric oxide surface areas adjacent to electrically conductive surface areas, chemically bonding an anchor compound with the dielectric oxide surface areas so as to form an anchor layer, initiating the growth of a metal using the electrically conductive surface areas and growing the metal so that the anchor layer also bonds with the metal. The anchor compound has at least one functional group capable of forming a chemical bond with the oxide surface and has at least one functional group capable of forming a chemical bond with the metal. Another aspect of the present invention is an electronic device. A third aspect of the present invention is a solution comprising the anchor compound.

34 Claims, 3 Drawing Sheets

(56) References Cited

U.S. PATENT DOCUMENTS

| | | | |
|---|---|---|---|
| 6,503,343 B1* | 1/2003 | Tench et al. | 148/272 |
| 6,680,273 B2* | 1/2004 | Goosey et al. | 502/150 |
| 6,794,288 B1 | 9/2004 | Kolics et al. | |
| 6,900,128 B2 | 5/2005 | Sinha | |
| 6,902,605 B2 | 6/2005 | Kolics et al. | |
| 6,911,067 B2 | 6/2005 | Kolics et al. | |
| 6,933,230 B2* | 8/2005 | Dubin | 438/660 |
| 7,268,074 B2* | 9/2007 | Yakobson et al. | 438/653 |
| 7,294,565 B2* | 11/2007 | Burrell et al. | 438/582 |
| 7,365,011 B2 | 4/2008 | Lavoie et al. | |
| 7,659,203 B2* | 2/2010 | Stewart et al. | 438/678 |
| 7,691,756 B2* | 4/2010 | Farkas et al. | 438/780 |
| 8,158,532 B2* | 4/2012 | Mayer et al. | 438/754 |
| 8,308,858 B2* | 11/2012 | Stewart et al. | 106/1.11 |
| 2004/0175509 A1 | 9/2004 | Kolics et al. | |
| 2005/0014359 A1* | 1/2005 | Segawa et al. | 438/622 |
| 2005/0074959 A1* | 4/2005 | Burrell et al. | 438/617 |
| 2005/0101130 A1 | 5/2005 | Lopatin et al. | |
| 2005/0136185 A1* | 6/2005 | Ramanathan et al. | 427/299 |
| 2006/0189129 A1* | 8/2006 | Baskaran et al. | 438/652 |
| 2006/0246217 A1* | 11/2006 | Weidman et al. | 427/99.5 |
| 2006/0246699 A1* | 11/2006 | Weidman et al. | 438/597 |
| 2006/0251800 A1* | 11/2006 | Weidman et al. | 427/99.5 |
| 2006/0251801 A1* | 11/2006 | Weidman et al. | 427/99.5 |
| 2006/0252252 A1* | 11/2006 | Zhu et al. | 438/618 |
| 2006/0264043 A1* | 11/2006 | Stewart et al. | 438/678 |
| 2007/0004201 A1* | 1/2007 | Lubomirsky et al. | 438/678 |
| 2007/0065585 A1* | 3/2007 | Chebiam et al. | 427/282 |
| 2007/0108060 A1* | 5/2007 | Park | 205/183 |
| 2007/0108404 A1* | 5/2007 | Stewart et al. | 252/79.1 |
| 2007/0134912 A1* | 6/2007 | Kim | 438/625 |
| 2007/0269981 A1* | 11/2007 | Lavoie | 438/678 |
| 2011/0059611 A1* | 3/2011 | Mellies | 438/678 |
| 2013/0078808 A1* | 3/2013 | Kolics | 438/678 |

OTHER PUBLICATIONS

USPTO Office Action for U.S. Appl. No. 12/334,460, Kolics, Mailed on Dec. 7, 2011.

A Silane Primer: Chemistry and Applications of Alkoxy Silanes, G. Witucki, Journal of Coatings Technology, vol. 65 (1993) No. 822 pp. 57-60.

* cited by examiner

US 8,895,441 B2

METHODS AND MATERIALS FOR ANCHORING GAPFILL METALS

CROSS REFERENCES

This application is related to U.S. patent application Ser. No. 12/334,460, titled "ACTIVATION SOLUTION FOR ELECTROLESS PLATING ON DIELECTRIC LAYERS" to Artur KOLICS, filed Dec. 21, 2007 which is incorporated herein, in its entirety, by this reference.

BACKGROUND

This invention pertains to fabrication of electronic devices such as integrated circuits; more specifically, this invention relates to methods and compositions to improve the adhesion between gapfill metals and dielectrics for electronic devices.

Electroless deposition is a process that is frequently used in the fabrication of electronic devices. The process is particularly important for applications requiring deposition of metal layers such as gapfill metal on substrates comprising metal surface areas and dielectric surface areas such as structures for damascene and/or dual damascene devices. These processes are also in use for applications such as forming electrical connections to metal contacts for integrated circuits. Electroless deposition processes can readily proceed on certain catalytic or activated surfaces. The adhesion to the catalytic or activated surfaces may be satisfactory. Similarly, chemical vapor deposition processes used for depositing metals on the metal surfaces may also have satisfactory adhesion. However, metals deposited by electroless deposition and metals deposited by chemical vapor deposition may have poor adhesion to dielectric surfaces. Consequently, the deposited metals may be attached or held only by the metal surface areas of the substrate. Such surfaces may provide only a small portion of the contact surface area in comparison to contact with the dielectric surfaces and the overall adhesion of the metal to the substrate may be insufficient for subsequent processes.

There is a need for methods and materials for improving the adhesion of metal such as gapfill metal to dielectric surfaces for the fabrication of a variety of electronic devices.

SUMMARY

This invention pertains to electronic devices, more particularly, to metallization of electronic devices. The present invention provides one or more improvements in the solutions used for and methods of fabricating electronic devices such as for fabricating semiconductor devices that include integrated circuits.

One aspect of the present invention includes a method of fabricating an electronic device. According to one embodiment, the method comprises providing a substrate having dielectric oxide surface areas adjacent to electrically conductive surface areas, chemically bonding an anchor compound with the dielectric oxide surface areas so as to form an anchor layer, initiating the growth of a metal using the electrically conductive surface areas, and growing the metal so that the anchor layer also bonds with the metal. The anchor compound has at least one functional group capable of forming a chemical bond with the dielectric oxide surface and has at least one functional group capable of forming a chemical bond with the metal. Another aspect of the present invention is an electronic device. A third aspect of the present invention is a solution comprising the anchor compound.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception upon which this disclosure is based may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

Figure 1:
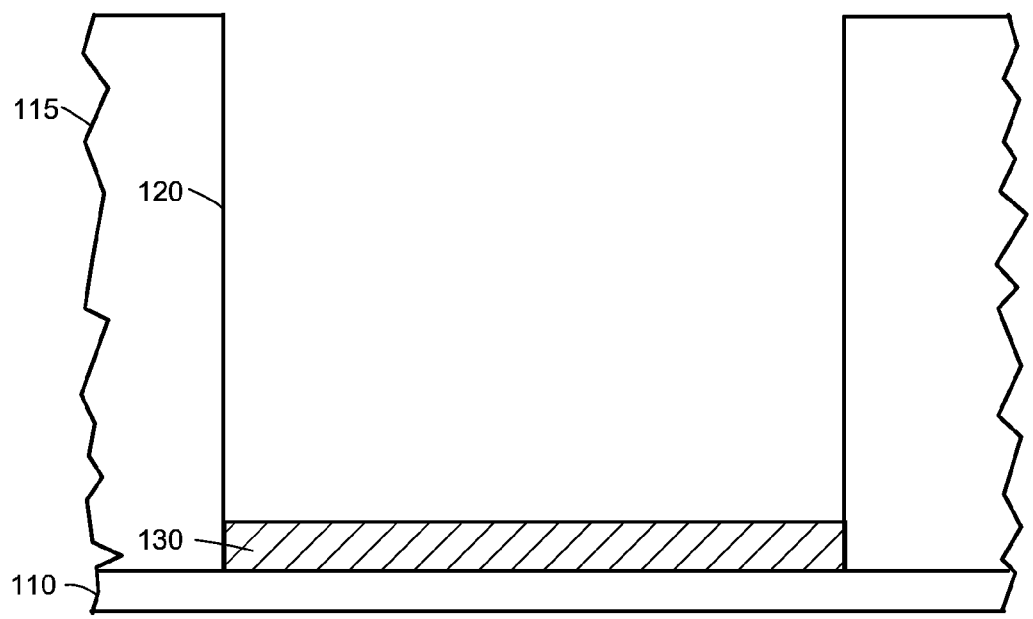
FIG. 1 is a cross-section side view diagram of a substrate being processed according to an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

This invention pertains to electronic devices, more particularly, to metallization of electronic devices. The present invention seeks to overcome one or more problems in fabricating electronic devices such as for fabricating semiconductor devices that use integrated circuits.

For the following defined terms, these definitions shall be applied, unless a different definition is given in the claims or elsewhere in this specification. All numeric values are herein defined as being modified by the term "about," whether or not explicitly indicated. The term "about" generally refers to a range of numbers that a person of ordinary skill in the art would consider equivalent to the stated value to produce substantially the same properties, function, result, etc. A numerical range indicated by a low value and a high value is defined to include all numbers subsumed within the numerical range and all subranges subsumed within the numerical range. As an example, the range 10 to 15 includes, but is not limited to, 10, 10.1, 10.47, 11, 11.75 to 12.2, 12.5, 13 to 13.8, 14, 14.025, and 15.

The term "metal" is used herein to refer to a metal element in the periodic table of the elements and/or to metal alloys comprising one or more metal elements mixed with at least one other element; the metal and the metal alloys have the general properties of metal elements from the periodic table of the elements such as high electrical conductivity.

The term "valence" of a chemical element is defined here as the maximum number of univalent atoms that may combine with an atom of the element under consideration, or with a fragment, or for which an atom of this element can be substituted in accordance with the International Union of Pure and Applied Chemist Compendium of Chemical Terminology, 2nd Edition (1997).

The term "anchor compound" is used herein to refer to a molecule or ion having one or more functional groups that form a chemical bond with an oxide surface and one or more functional groups that form a chemical bond with a metal or metal alloy having properties suitable for use as gapfill metal in an electronic device.

Embodiments of and the operation of embodiments of the present invention will be discussed below primarily in the context of processing semiconductor wafers such as silicon wafers used for fabricating integrated circuits. The following discussion is primarily directed towards silicon electronic devices that use metallization layers having metal layers formed on or in oxide dielectric structures such as metal layers used for fabricating gate contacts. However, it is to be understood that embodiments in accordance with the present invention may be used for other semiconductor devices, a variety of metal layers, and semiconductor wafers other than silicon.

In the following description of the figures, identical reference numerals have been used when designating substantially identical elements or processes that are common to the figures.

Figure 2:
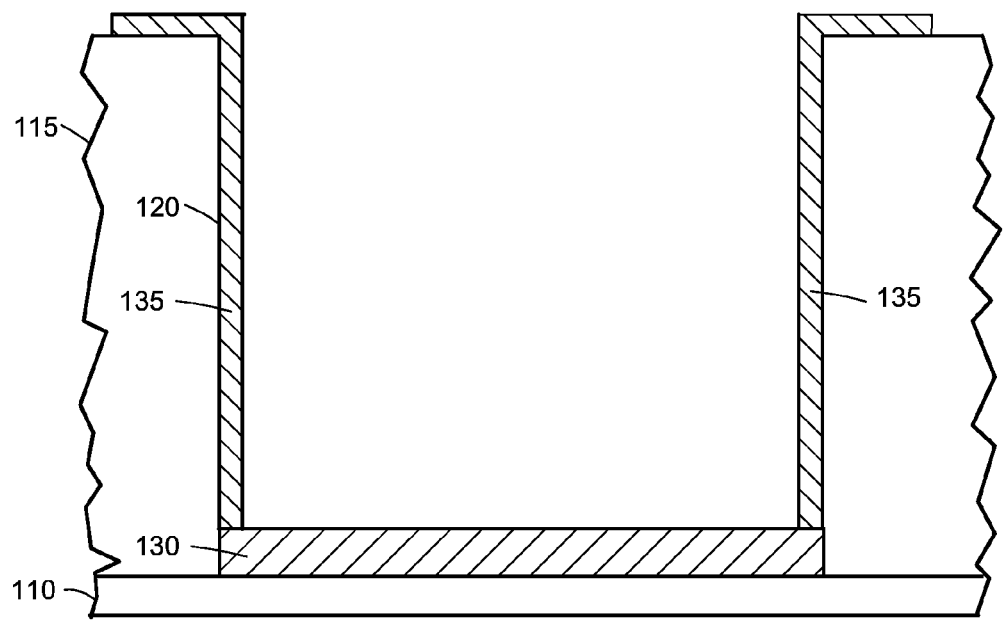
FIG. 2 is a cross-section side view diagram of a substrate being processed according to an embodiment of the present invention.
Figure 3:
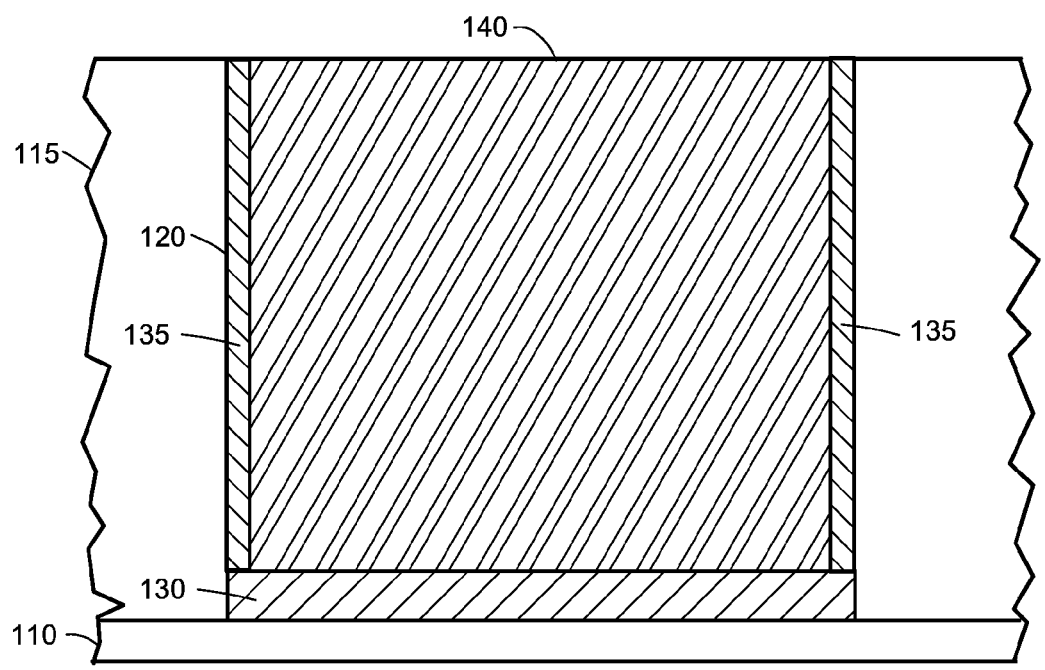
FIG. 3 is a cross-section side view diagram of a substrate processed according to an embodiment of the present invention.

One aspect of the present invention includes a method of fabricating an electronic device. Reference is now made to FIG. 1, FIG. 2, and FIG. 3, where there is shown a cross-section side view of a substrate being processed by methods according to one or more embodiments of the present invention. According to one embodiment of the present invention, the method comprises providing a substrate 101. As shown in FIG. 1, substrate 101 includes a base 110 and a dielectric oxide 115 on base 110. Dielectric oxide 115 has one or more vias and/or one or more trenches 120 formed therein. The one or more vias and/or one or more trenches 120 expose electrically conductive areas such as metal contact 130. Areas of dielectric oxide 115 are adjacent to the electrically conductive areas such as metal contact 130. Metal contact 130 may be essentially the same as metal contacts such as those for semiconductor circuits. As an option for one or more embodiments of the present invention, the electrically conductive areas may be a silicide such as, but not limited to, nickel platinum silicide for a semiconductor circuit contact.

The method further comprises chemically bonding an anchor compound with the dielectric oxide surface areas to form an anchor layer 135 as illustrated in FIG. 2. In general, the anchor compound has at least one functional group capable of forming a chemical bond with the oxide surface and has at least one functional group capable of forming a chemical bond with a gapfill metal. The anchor compound has suitable properties and is applied under conditions so that the anchor compound substantially only forms a bond with the dielectric oxide to form anchor layer 135 on dielectric 115 substantially without forming a bond with metal contact 130. Consequently, anchor layer 135 is present on dielectric 115, but is not present on metal contact 130. Anchor layer 135 comprises a chemical reaction product from a reaction of dielectric oxide layer 115 with the anchor compound.

The method further comprises initiating the growth of a metal using the electrically conductive surface area shown as metal contact 130 and growing the metal to fill the one or more trenches and/or one or more vias with a gapfill metal 140 so that the anchor compound also bonds with the metal contacting the dielectric oxide surface areas.

In one or more embodiments of the method of fabricating electronic devices, gapfill metal 140 is selectively deposited. Optionally, gapfill metal 140 may be selectively deposited by a process such as electroless deposition or gapfill metal 140 may be selectively deposited by a process such as chemical vapor deposition. More specifically, the gapfill metal growth is started at a metal contact such as metal contact 130 at the bottom of a via or the bottom of a trench that has been formed in dielectric 115. The gapfill metal growth is continued so as to achieve a bottom-up fill of the via and/or the trench.

According to one or more embodiments of the present invention, electroless deposition of gapfill metal 140 is accomplished by placing the substrate with anchor layer 135 into an electroless deposition solution. The electroless deposition solution is formulated so as to form a metal, metal alloy, or metal composite layer. Descriptions of electroless deposition processes suitable for one or more embodiments of the present invention can be found in U.S. Pat. No. 6,794,288 to Kolics et al. and U.S. Pat. No. 6,911,076 to Kolics et al.; the contents of all of these patents are incorporated herein, in their entirety by this reference.

It should be noted that the diagrams in FIG. 1, FIG. 2, and FIG. 3 are not drawn to scale. More specifically, the thickness of anchor layer 120 is exaggerated for the purpose of illustration. Furthermore, the diagram in FIG. 3 shows electronic device 103 having metal layer 140 as a gapfill metal. Still further, the diagram shown in FIG. 3 presents a planarized surface so as to form a damascene metallization structure.

According to one or more embodiments of the present invention, the method includes using an anchor compound that comprises an inorganic oxoanion, an amine, an imine, a cyanide, or combinations thereof. One or more other embodiments of the present invention use anchor compounds having functional groups that can form complexes with ions of the metal used for the gapfill and/or functional groups that adsorb strongly on the gapfill metal. Embodiments of the present invention that use cobalt in the gapfill metal comprise using anchor compounds having functional groups that can form complexes with ions of cobalt and/or functional groups that adsorb strongly on cobalt.

According to one or more embodiments of the present invention, the method includes using an anchor compound that comprises an inorganic oxoanion having the general formula $A_xO_y^{Z-}$ wherein, A is a chemical element, O is oxygen, X is an integer, Y is an integer, and Z is an integer. Some examples of inorganic oxoanions for one or more embodiments of the present invention include, but are not limited to, phosphates and phosphites.

According to one or more embodiments of the present invention, the method includes using an anchor compound having the general formula:

$$(R_1-O)_{V-n}MG_n \text{ where}$$

M is germanium, hafnium, indium, silicon, tantalum, tin, titanium, or tungsten;

G is a functional group capable of forming a chemical bond with the metal;

$R_1$—O is a functional group capable of forming a chemical bond with the oxide surface, O is oxygen;

V is the valence of M; and n is an integer from 1 to V−1.

According to one embodiment of the present invention, $R_1$ is an alkyl group, M is silicon, and G is an alkylamine.

One or more embodiments of the present invention include using anchor compounds of the formula presented above wherein $G_n$ comprises groups such as, but not limited to, amine, imine, epoxy, hydroxyl, carboxy, carboxylate, phosphate, phosphonate, or combinations thereof. Optionally, one or more embodiments of the present invention include using anchor compounds wherein $G_n$ comprises, sulfonate, boronate, carbonate, bicarbonate, or combinations thereof. One or more embodiments of the present invention include using anchor compounds wherein $(R_1-O)_{V-n}$ comprises methoxy, ethoxy, propoxy, or combinations thereof. One or more embodiments of the present invention include using anchor compounds wherein $(R_1-O)_{V-n}$ comprises methoxy, ethoxy, propoxy, or combinations thereof and G comprises amine, imine, epoxy, hydroxyl, carboxy, carboxylate, phosphate, phosphonate, or combinations thereof.

According to one or more embodiments of the present invention, the method includes using an anchor compound that comprises mono-alkoxy silane or di-alkoxy silane and at least one from the group consisting of an amine group, an imine group, a carboxylate group, a cyanide group, a phosphate group, a phosphite group, a phosphonate group, and an epoxy group.

According to one or more embodiments of the present invention, the method further comprises making the surface of metallization contacts such as metal contact 130 substantially oxide free prior to the chemically bonding an anchor compound with dielectric oxide 115. This additional process is optional and may only be used for metallization contacts that are susceptible to oxide formation. The oxide is removed from the metallization contact so that the subsequent process of bonding the anchor compound to the dielectric oxide does not bond the anchor compound to oxide formed on the metallization contact.

Methods according to one or more embodiments of the present invention may also include a thermal process to more completely bond the anchor layer to the dielectric. The thermal process may include heating the substrate during and/or after exposing the substrate to the anchor compound. According to one or more embodiments of the present invention the thermal process is performed prior to beginning the growth of the gapfill metal.

According to one or more embodiments of the present invention, examples of dielectric oxides suitable for use as dielectric oxide 115 include, but are not limited to, aluminum oxide ($Al_2O_3$), silicon dioxide ($SiO_2$), carbon doped silicon dioxide (SiOC), silicon oxide-based low k dielectrics, and silicon oxides such as SiOCH, SiON, SiOCN, and SiOCHN. Alternative oxides for embodiments of the present invention include, but are not limited to, tantalum pentoxide ($Ta_2O_5$) and titanium dioxide ($TiO_2$). Optionally, the dielectric oxide, according to one or more embodiments of the present invention, may be a surface oxide formed on a dissimilar material such as silicon oxide formed on materials such as, but not limited to, aluminum nitride, silicon nitride, silicon carbonitride, and silicon carbide.

One or more embodiments of the present invention may include using a variety of gapfill metals. Examples of gapfill metals suitable for one or more embodiments of the present invention include, but are not limited to, metals comprising cobalt, copper, gold, iridium, nickel, osmium, palladium, platinum, rhenium, ruthenium, rhodium, silver, tin, zinc, electrolessly plated alloys, or mixtures thereof. According to one embodiment of the present invention, the gapfill metal comprises cobalt. According to another embodiment of the present invention, the gapfill metal comprises cobalt and the metal contact comprises nickel platinum silicide. According to another embodiment of the present invention, the gapfill metal comprises cobalt, the metal contact comprises nickel platinum silicide, and the anchor compound comprises an oxoanion.

A variety of compounds can be used for anchor compounds according to one or more embodiments of the present invention. According to one embodiment of the present invention, the anchor compounds are applied to the substrates as liquids or as components of liquid solutions using wet chemical processes. According to one or more embodiments of the present invention, the anchor compounds are dissolved in liquids such as, but not limited to, water, water-soluble solvents, dimethylsulfoxide, formamide, acetonitrile, alcohol, or mixtures thereof. Other water-soluble solvents suitable for embodiments of the present invention will be clear to persons of ordinary skill in the art, in view of the present disclosure. According to another embodiment of the present invention, the anchor compounds are applied to the substrates as a gas or vapor using dry chemical processing or using substantially dry chemical processes. More specifically, according to one or more embodiments of the present invention, the anchor compound is applied to the substrates as a gas under conditions so that the anchor compound bonds to the dielectric oxide of the substrates. Optionally, the gas phase anchor compound may be mixed with another gas such as, but not limited to, a substantially inert carrier gas.

In another embodiment of the present invention, anchor layer 135 is formed by immersing the substrate in the anchor compound or in a solution containing the anchor compound to bond the anchor compound to the oxide surface for a time from about 30 seconds to about 600 seconds at a temperature from about 10° C. to about 95° C. According to another embodiment, the substrate is immersed in a solution containing the anchor compound to bond the anchor compound to the oxide surface from about 60 seconds to about 180 seconds at a temperature from about 50° C. to about 70° C.

According to one or more embodiments of the present invention, the method comprises providing a substrate having metallization contacts and dielectric oxide. The dielectric oxide has vias to the metallization contacts. The method includes bonding an anchor compound with the dielectric oxide by exposing the dielectric oxide to the anchor compound and/or to a solution containing the anchor compound so as to form an anchor layer on the dielectric oxide. The method further includes initiating the selective growth of a gapfill metal using the metallization contacts. Optionally, the selective growth of the gapfill metal may be accomplished using processes such as, but not limited to, atomic layer deposition, chemical vapor deposition, and electroless deposition. The gapfill metal is grown so that the anchor layer formed by the anchor compound bonding with the dielectric oxide also bonds with the gapfill metal that is adjacent to or contacts the dielectric oxide. The anchor compound and the resulting anchor layer are selected so that they do not significantly cause growth of the gapfill metal. More specifically, the growth of the gapfill metal is the result of growth initiated by the metal contact at the bottom of the trench and/or via. The growth of the metal gapfill is continued so that the vias and/or trenches are at least filled with the gapfill metal. A planarization process may be used after completion of the gapfill. According to one or more embodiments of the present invention, the gapfill metal is a metal comprising cobalt or a cobalt alloy.

Another aspect of the present invention comprises an electronic device such as, but not limited to, an integrated circuit. Reference is again made to FIG. 3. According to one embodiment of the present invention, the electronic device comprises a base 110 such as a semiconductor wafer, a metallization contact 130, a dielectric oxide 115 having a via 120 to the metallization contact 130, a gapfill metal 140 grown from metallization contact 130 substantially filling via 120, and an anchor layer 135 chemically bonded between the surface of dielectric oxide 115 and gapfill metal 140. The electronic device has substantially none of the anchor layer between the interface at metallization contact 130 and gapfill metal 140.

According to one or more embodiments of the present invention, the anchor layer is a chemical reaction product from a reaction of the oxide surface and a reaction of the gapfill metal with an anchor compound having the general formula:

$$(R_1-O)_{V-n}MG_n \text{ where}$$

M is germanium, hafnium, indium, silicon, tantalum, tin, titanium, or tungsten;

G is a functional group capable of forming a chemical bond with the metal;

$R_1$—O is a functional group capable of forming a chemical bond with the oxide surface, O is oxygen;

V is the valence of M; and n is an integer from 1 to V−1.

According to one embodiment of the present invention, $R_1$ is an alkyl group, M is silicon, and G is an alkylamine. As an option for one or more embodiments of the present invention, G comprises amine, imine, epoxy, hydroxyl, carboxy, carboxylate, phosphate, phosphonate, or combinations thereof. As an option for one or more embodiments of the present invention, $R_1$— is an alkyl group.

According to one or more embodiments of the present invention, the anchor compound comprises mono-alkoxy silane or di-alkoxy silane and at least one from the group consisting of an amine group, an imine group, a carboxylate group, a cyanide group, a phosphate group, a phosphite group, a phosphonate group, and an epoxy group.

According to one or more embodiments of the present invention, the anchor compounds have the formula presented above wherein $G_n$ comprises groups such as, but not limited to, amine, imine, epoxy, hydroxyl, carboxy, carboxylate, phosphate, phosphonate, or combinations thereof. According to one or more embodiments of the present invention, the anchor compounds have the formula presented above wherein $G_n$ comprises, sulfonate, boronate, carbonate, bicarbonate, or combinations thereof. According to one or more embodiments of the present invention, the anchor compounds have the formula presented above wherein $(R_1-O)_{V-n}$ comprises methoxy, ethoxy, propoxy, or combinations thereof. According to one or more embodiments of the present invention, the anchor compounds have the formula presented above wherein $(R_1-O)_{4-n}$ comprises methoxy, ethoxy, propoxy, or combinations thereof and G comprises amine, imine, epoxy, hydroxyl, carboxy, carboxylate, phosphate, phosphonate, or combinations thereof.

According to one or more embodiments of the present invention, the anchor layer is a chemical reaction product from a reaction of the oxide surface and a reaction of the gapfill metal with an anchor compound that comprises an inorganic oxoanion, an amine, an imine, a cyanide, or combinations thereof. One or more other embodiments of the present invention use anchor compounds having functional groups that can form complexes with ions of the metal used for the gapfill and/or functional groups that adsorb strongly on the gapfill metal. Embodiments of the present invention that use cobalt in the gapfill metal comprise using anchor compounds having functional groups that can form complexes with ions of cobalt and/or functional groups that adsorb strongly on cobalt.

According to one or more embodiments of the present invention, the anchor layer is a chemical reaction product from a reaction of the oxide surface and a reaction of the gapfill metal with an anchor compound that comprises an inorganic oxoanion having the generic formula $A_XO_Y^{Z-}$ wherein, A is a chemical element, O is oxygen, X is an integer, Y is an integer, and Z is an integer. Some examples of inorganic oxoanions for one or more embodiments of the present invention include, but are not limited, phosphates and phosphites.

According to one or more embodiments of the present invention the dielectric oxide such as dielectric oxide 115 comprises oxides such as, but not limited to, aluminum oxide ($Al_2O_3$), silicon dioxide ($SiO_2$), carbon doped silicon dioxide (SiOC), silicon oxide-based low k dielectrics, and silicon oxides such as SiOCH, SiON, SiOCN, and SiOCHN. Alternative oxides for embodiments of the present invention include but are not limited to tantalum pentoxide ($Ta_2O_5$) and titanium dioxide ($TiO_2$). Optionally, the dielectric oxide, according to one or more embodiments of the present invention, may be a surface oxide formed on a dissimilar material such as oxide formed on materials such as, but not limited to, aluminum nitride, silicon nitride, silicon carbonitride, and silicon carbide.

One or more embodiments of the present invention may include using a variety of gapfill metals. Examples of gapfill metals suitable for one or more embodiments of the present invention include, but are not limited to, metals comprising cobalt, copper, gold, iridium, nickel, osmium, palladium, platinum, rhenium, ruthenium, rhodium, silver, tin, zinc, electrolessly plated alloys, or mixtures thereof. According to one embodiment of the present invention the gapfill metal comprises cobalt. According to another embodiment of the present invention the gapfill metal comprises cobalt and the metal contact comprises nickel platinum silicide. According to another embodiment of the present invention gapfill metal comprises cobalt, the metal contact comprises nickel platinum silicide, and the anchor compound comprises an oxoanion.

According to one or more embodiments of the present invention, the method of making electronic devices described above and the electronic devices described above include using a liquid solution to bond an anchor compound to an oxide dielectric to form an anchor layer. The anchor compound has at least one functional group capable of forming a chemical bond with the oxide surface and has at least one functional group capable of forming a chemical bond with the metal.

According to one or more embodiments of the present invention, the solution comprises an anchor compound having the general formula:

$$(R_1-O)_{V-n}MG_n \text{ where}$$

M is germanium, hafnium, indium, silicon, tantalum, tin, titanium, or tungsten;

G is a functional group capable of forming a chemical bond with the metal;

$R_1$—O is a functional group capable of forming a chemical bond with the oxide surface, O is oxygen;

V is the valence of M; and n is an integer from 1 to V−1.

According to one embodiment of the present invention, $R_1$ is an alkyl group, M is silicon, and G is an alkylamine. As an option for one or more embodiments of the present invention, G comprises amine, imine, epoxy, hydroxyl, carboxy, carboxylate, phosphate, phosphonate, or combinations thereof. As an option for one or more embodiments of the present invention, $R_1$— is an alkyl group.

According to one or more embodiments of the present invention, the anchor compound in the solution comprises mono-alkoxy silane or di-alkoxy silane and at least one from the group consisting of an amine group, an imine group, a carboxylate group, a cyanide group, a phosphate group, a phosphite group, a phosphonate group, and an epoxy group.

According to one or more embodiments of the present invention, the anchor compounds have the formula presented above wherein $G_n$ comprises groups such as, but not limited to, amine, imine, epoxy, hydroxyl, carboxy, carboxylate, phosphate, phosphonate, or combinations thereof. According to one or more embodiments of the present invention, the anchor compounds have the formula presented above wherein $G_n$ comprises, sulfonate, boronate, carbonate, bicarbonate, or combinations thereof. According to one or more embodiments of the present invention, the anchor compounds have the formula presented above wherein $(R_1-O)_{V-n}$ comprises methoxy, ethoxy, propoxy, or combinations thereof. According to one or more embodiments of the present invention, the anchor compounds have the formula presented above wherein $(R_1-O)_{V-n}$ comprises methoxy, ethoxy, propoxy, or combinations thereof and G comprises amine, imine, epoxy, hydroxyl, carboxy, carboxylate, phosphate, phosphonate, or combinations thereof.

According to one or more embodiments of the present invention, the solution includes anchor compounds comprising an inorganic oxoanion, an amine, an imine, a cyanide, or combinations thereof. One or more other embodiments of the present invention, the solution includes anchor compounds having functional groups that can form complexes with ions of the metal used for the gapfill and/or functional groups that adsorb strongly on the gapfill metal. For embodiments of the present invention that use cobalt in the gapfill metal, the solution comprises anchor compounds having functional groups that can form complexes with ions of cobalt and/or functional groups that adsorb strongly on cobalt.

According to one or more embodiments of the present invention, the solution includes an anchor compound that comprises an inorganic oxoanion having the generic formula $A_xO_Y^{Z-}$ wherein, A is a chemical element, O is oxygen, X is an integer, Y is an integer, and Z is an integer. Some examples of inorganic oxoanions for one or more embodiments of the present invention include, but are not limited, phosphates and phosphites.

According to one or more embodiments of the present invention, the solution comprises an amount of water-soluble solvent which is optional; an amount of anchor compound having at least one functional group capable of forming a chemical bond with the oxide surface and having at least one functional group capable of forming a chemical bond with the gapfill metal; and an amount of water. According to one or more embodiments of the present invention, the solution comprises a solvent and an anchoring agent without a water soluble solvent. According to one or more embodiments of the present invention the anchor compound comprises an inorganic oxoanion, such as but not limited to, a phosphate, a phosphite, an amine, an imine, a cyanide, and combinations thereof or functional groups that can form complexes with metal ions and/or adsorb strongly on the gapfill metal.

According to one embodiment of the present invention, the solution comprises an amount of anchor compound. In general, the anchor compound has at least one functional group capable of forming a chemical bond with the oxide surface and has at least one functional group capable of forming a chemical bond with the gapfill metal. In another embodiment of the present invention, the solution comprises an amount of water-soluble solvent, an amount of anchor compound, and an amount of water.

The anchor compounds for embodiments of the present invention can have numerous chemical compositions. There are many choices for the at least one functional group capable of forming a chemical bond with the oxide surface and for the at least one functional group capable of forming a chemical bond with the metal. Some embodiments of the present invention may include anchor compounds having two or three or more functional groups capable of forming a chemical bond with the oxide surface. Similarly, some embodiments of the present invention may include anchor compounds having two or three or more functional groups capable of forming a chemical bond with the gapfill metal. Optionally, anchor compounds may be selected that include different types of functional groups capable of forming chemical bonds with the oxide surface. Anchor compounds may be selected that include different types of functional groups capable of forming chemical bonds with the metal. Embodiments of the present invention may also use mixtures of different types of anchor compounds.

According to one embodiment of the present invention, the anchor compound includes an alkoxysilane such as a monoalkoxy silane, such as a di-alkoxy silane, and such as a tri-alkoxy silane for forming the chemical bond with the oxide surface. The anchor compound further includes one or more polar groups such as, but not limited to, an amine group, an imine group, a carboxylate group, a phosphate group, a phosphonate group, and an epoxy group forming the chemical bond with the gapfill metal. As an option, anchor compounds according to some embodiments of the present invention may include dissimilar polar groups or mixtures of dissimilar polar groups. For specific embodiments of the present invention, the type and amount of anchor compound is selected so that the solution provides an effective amount of the anchor compound to the oxide surface to accomplish increased bonding between the oxide and the gapfill metal.

For another embodiment of the present invention, the solution includes an anchor compound having the general formula $(R_1-O)_{V-n}MG_n$ where M is germanium, hafnium, indium, silicon, tantalum, tin, titanium, or tungsten; G is the functional group capable of forming the chemical bond with the gapfill metal; $R_1-O$ is the functional group capable of forming the chemical bond with the oxide surface, O is oxygen; V is the valence of M; and n is an integer from 1 to V−1. One embodiment of the present invention has G comprising one or more polar groups such as, but not limited to, amine, imine, epoxy, hydroxyl, carboxy, carboxylate, phosphate, phosphonate, sulfonate, boronate, carbonate, bicarbonate, or combinations thereof. Preferably, $R_1$ is an organic group such as an alkyl group and $R_1-O$ is an alkoxy group such as methoxy, ethoxy, and propoxy. For another embodiment of the present invention, $(R_1-O)_{V-n}$ includes one or more groups such as, but not limited to, methoxy, ethoxy, propoxy, and combinations thereof and $G_n$ comprises one or more groups such as, but not limited to, amine, imine, epoxy, hydroxyl, carboxy, carboxylate, phosphate, phosphonate, and combinations thereof. In another preferred embodiment, $R_1$ is an alkyl group, M is silicon, and G is an alkylamine.

Another embodiment of the present invention is a solution comprising components for electroless deposition and an anchor compound. The components for electroless deposition may comprise, but are not limited to, a solvent, a reducing agent for electroless deposition, and ions and/or complexes of one or more metals for electroless deposition of a gapfill metal. Descriptions of typical electroless deposition solutions and components of electroless deposition solutions can be found in commonly only owned patents U.S. Pat. No. 6,794,288 to Kolics et al. and U.S. Pat. No. 6,911,076 to Kolics et al.; the contents of all of these patents are incorporated herein, in their entirety, by this reference. Descriptions of other electroless deposition solutions and components of electroless deposition solutions are also available elsewhere in the scientific and patent literature.

The anchor compound has at least one functional group capable of forming a chemical bond with an oxide surface and has at least one functional group capable of forming a chemical bond with the gapfill metal. Details and examples of anchor compounds included in solution with components for electroless deposition according to one or more embodiments of the present invention are presented above.

A solution, according to one embodiment of the present invention, comprises components for electroless deposition and an anchor compound. The anchor compound has the general formula $(R_1-O)_{V-n}MG_n$ where M is germanium, hafnium, indium, silicon, tantalum, tin, titanium, or tungsten;

G is a functional group capable of forming the chemical bond with the metal;

$R_1-O$ is the functional group capable of forming the chemical bond with the oxide surface, O is oxygen;

V is the valence of M; and n is an integer from 1 to V−1.

A solution, according to one embodiment of the present invention, comprises components for electroless deposition and an anchor compound. The anchor compound comprises an inorganic oxoanion, a phosphate, a phosphite, a phosphonate, an amine, an imine, a cyanide, or combinations thereof.

A solution, according to one embodiment of the present invention, comprises components for electroless deposition and an anchor compound. The anchor compound comprises inorganic oxoanions, amines, imines, cyanides, functional groups that form complexes with ions of the gapfill metal, functional groups that adsorb strongly on the gapfill metal, or combinations thereof.

A solution, according to one embodiment of the present invention, comprises components for electroless deposition and an anchor compound. The anchor compound comprises inorganic oxoanions having the general formula $A_XO_Y^{Z-}$ wherein, A is a chemical element, O is oxygen, X is an integer, Y is an integer, and Z is an integer.

A solution, according to one embodiment of the present invention, comprises components for electroless deposition and an anchor compound. The anchor compound comprises mono-alkoxy silane, di-alkoxy silane, or tri-alkoxy silane and at least one member from the group consisting of an amine group, an imine group, a carboxylate group, a phosphate group, a phosphonate group, and an epoxy group.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. A method of fabricating an electronic device, the method comprising:
providing a substrate having dielectric oxide surface areas adjacent to electrically conductive surface areas;
chemically bonding an anchor compound with the dielectric oxide surface areas so as to form an anchor layer;
initiating the growth of a metal using the electrically conductive surface areas and growing the metal so that the anchor layer bonds with the metal,
wherein the anchor compound comprises an inorganic oxoanion having the generic formula $A_XO_Y^{Z-}$ wherein, A is a chemical element, O is oxygen, X is an integer, Y is an integer, and Z is an integer.

2. The method of claim 1, wherein the anchor compound has at least one functional group capable of forming a chemical bond with the oxide surface and having at least one functional group capable of forming a chemical bond with the metal.

3. The method of claim 1, wherein the anchor compound comprises an inorganic oxoanion, an amine, an imine, a cyanide, a functional group that forms complexes with ions of the metal, a functional group that adsorbs strongly on the metal, and or combinations thereof.

4. The method of claim 1, wherein the anchor compound comprises phosphate, phosphite, or phosphonate.

5. The method of claim 1, further comprising making the surface of the metallization contacts substantially oxide free prior to the chemically bonding an anchor compound with the dielectric oxide.

6. The method of claim 1, wherein the dielectric oxide is a surface oxide formed on a dissimilar material.

7. The method of claim 1, wherein the chemically bonding an anchor compound with the dielectric oxide surface areas is a dry chemical process using a gas comprising the anchor compound.

8. The method of claim 1, wherein chemically bonding an anchor compound with the dielectric oxide surface areas is a wet chemical process using a liquid solution comprising the anchor compound.

9. The method of claim 8, wherein the liquid solution further comprises dimethylsulfoxide, formamide, acetonitrile, alcohol, or mixtures thereof.

10. The method of claim 1, wherein the oxide surface comprises at least one selected from the group consisting of $SiO_2$, SiOC, SiOCH, SiON, SiOCN, SiOCHN, $Ta_2O_5$, and $TiO_2$.

11. The method of claim 1, wherein the gapfill metal comprises cobalt, copper, gold, iridium, nickel, osmium, palladium, platinum, rhenium, ruthenium, rhodium, silver, tin, zinc, electrolessly plated alloys, or mixtures thereof.

12. A method of fabricating an electronic device, the method comprising:
providing a substrate having dielectric oxide surface areas adjacent to electrically conductive surface areas;
chemically bonding an anchor compound with the dielectric oxide surface areas so as to form an anchor layer;

initiating the growth of a metal using the electrically conductive surface areas and growing the metal so that the anchor layer bonds with the metal, wherein the anchor compound comprises mono-alkoxy silane, di-alkoxy silane, or tri-alkoxy silane and at least one from the group consisting of an amine group, an imine group, a carboxylate group, a cyanide group, a phosphate group, a phosphite group, a phosphonate group, and an epoxy group.

13. The method of claim 12, wherein the anchor compound has at least one functional group capable of forming a chemical bond with the oxide surface and having at least one functional group capable of forming a chemical bond with the metal.

14. The method of claim 12, wherein the anchor compound comprises an inorganic oxoanion, an amine, an imine, a cyanide, a functional group that forms complexes with ions of the metal, a functional group that adsorbs strongly on the metal, and or combinations thereof.

15. The method of claim 12, wherein the anchor compound comprises phosphate, phosphate, or phosphonate.

16. The method of claim 12, further comprising making the surface of the metallization contacts substantially oxide free prior to the chemically bonding an anchor compound with the dielectric oxide.

17. The method of claim 12, wherein the dielectric oxide is a surface oxide formed on a dissimilar material.

18. The method of claim 12, wherein the chemically bonding an anchor compound with the dielectric oxide surface areas is a dry chemical process using a gas comprising the anchor compound.

19. The method of claim 12, wherein chemically bonding an anchor compound with the dielectric oxide surface areas is a wet chemical process using a liquid solution comprising the anchor compound.

20. The method of claim 19, wherein the liquid solution further comprises dimethylsulfoxide, formamide, acetonitrile, alcohol, or mixtures thereof.

21. The method of claim 12, wherein the oxide surface comprises at least one selected from the group consisting of $SiO_2$, SiOC, SiOCH, SiON, SiOCN, SiOCHN, $Ta_2O_5$, and $TiO_2$.

22. The method of claim 12, wherein the gapfill metal comprises cobalt, copper, gold, iridium, nickel, osmium, palladium, platinum, rhenium, ruthenium, rhodium, silver, tin, zinc, electrolessly plated alloys, or mixtures thereof.

23. A method of fabricating an electronic device, the method comprising:
providing a substrate having dielectric oxide surface areas adjacent to electrically conductive surface areas;
chemically bonding an anchor compound with the dielectric oxide surface areas so as to form an anchor layer;
initiating the growth of a metal using the electrically conductive surface areas and growing the metal so that the anchor layer bonds with the metal,
wherein the anchor compound has the general formula $(R_1-O)_{V-n}MG_n$ where
M is germanium, hafnium, indium, silicon, tantalum, tin, titanium, or tungsten;
G is a functional group capable of forming the chemical bond with the metal;
$R_1-O$ is the functional group capable of forming the chemical bond with the oxide surface, O is oxygen;
V is the valence of M; and
n is an integer from 1 to V−1.

24. The method of claim 23, wherein $R_1$ is an alkyl group, M is silicon, and G is an alkylamine.

25. The method of claim 23, wherein the anchor compound has at least one functional group capable of forming a chemical bond with the oxide surface and having at least one functional group capable of forming a chemical bond with the metal.

26. The method of claim 23, wherein the anchor compound comprises an inorganic oxoanion, an amine, an imine, a cyanide, a functional group that forms complexes with ions of the metal, a functional group that adsorbs strongly on the metal, and or combinations thereof.

27. The method of claim 23, wherein the anchor compound comprises phosphate, phosphate, or phosphonate.

28. The method of claim 23, further comprising making the surface of the metallization contacts substantially oxide free prior to the chemically bonding an anchor compound with the dielectric oxide.

29. The method of claim 23, wherein the dielectric oxide is a surface oxide formed on a dissimilar material.

30. The method of claim 23, wherein the chemically bonding an anchor compound with the dielectric oxide surface areas is a dry chemical process using a gas comprising the anchor compound.

31. The method of claim 23, wherein chemically bonding an anchor compound with the dielectric oxide surface areas is a wet chemical process using a liquid solution comprising the anchor compound.

32. The method of claim 31, wherein the liquid solution further comprises dimethylsulfoxide, formamide, acetonitrile, alcohol, or mixtures thereof.

33. The method of claim 31, wherein the oxide surface comprises at least one selected from the group consisting of $SiO_2$, SiOC, SiOCH, SiON, SiOCN, SiOCHN, $Ta_2O_5$, and $TiO_2$.

34. The method of claim 23, wherein the gapfill metal comprises cobalt, copper, gold, iridium, nickel, osmium, palladium, platinum, rhenium, ruthenium, rhodium, silver, tin, zinc, electrolessly plated alloys, or mixtures thereof.

\* \* \* \* \*